United States Patent [19]

Rostoker et al.

[11] Patent Number: 5,728,599
[45] Date of Patent: Mar. 17, 1998

[54] PRINTABLE SUPERCONDUCTIVE LEADFRAMES FOR SEMICONDUCTOR DEVICE ASSEMBLY

[75] Inventors: Michael D. Rostoker, Boulder Creek; Mark Schneider, San Jose; Chok J. Chia, Campbell, all of Calif.

[73] Assignee: LSI Logic Corporation, Milpitas, Calif.

[21] Appl. No.: 432,539

[22] Filed: Aug. 7, 1995

Related U.S. Application Data

[62] Division of Ser. No. 143,843, Oct. 28, 1993, abandoned.

[51] Int. Cl.$^6$ ............ H01L 21/283; H01L 21/48; H01L 21/58; H01L 21/60
[52] U.S. Cl. ............ 437/182; 437/196; 437/217; 437/220; 505/191; 505/220; 505/330; 505/703; 505/706; 505/741
[58] Field of Search ............ 437/217, 220, 437/182, 196; 505/220, 491, 510, 703, 741, 883, 923, 191, 330, 706; 174/125.1

[56] References Cited

U.S. PATENT DOCUMENTS

| | | | |
|---|---|---|---|
| 4,561,202 | 12/1985 | Sera et al. | 174/254 |
| 4,994,434 | 2/1991 | Hung et al. | 505/1 |
| 5,105,200 | 4/1992 | Koepf | 343/853 |
| 5,164,336 | 11/1992 | Ohno et al. | 437/220 |
| 5,173,844 | 12/1992 | Adachi et al. | 361/414 |
| 5,286,713 | 2/1994 | Yokoyama et al. | 505/1 |
| 5,294,599 | 3/1994 | Shibata et al. | 505/1 |
| 5,468,679 | 11/1995 | Paz De Araujo et al. | 437/110 |
| 5,593,918 | 1/1997 | Rostoker et al. | 437/183 |

FOREIGN PATENT DOCUMENTS

| | | |
|---|---|---|
| 89-184858 | 7/1989 | Japan . |
| 89-302752 | 12/1989 | Japan . |
| 90-094551 | 4/1990 | Japan . |

*Primary Examiner*—David Graybill
*Attorney, Agent, or Firm*—Katz & Cotton, LLP

[57] ABSTRACT

Process for manufacturing a high interconnection density, fine-line, superconductive printed leadframes using thick-film screen-printing techniques, or other printing techniques. Generally, a superconductive leadframe pattern is printed on a backing substrate. Once the pattern is cured, the backing substrate, or portions thereof can be removed. The backing substrate can be a "fish paper" substrate treated with a release agent, or other substrate material which can be dissolved away, etched away, or otherwise removed. Portions of the backing substrate can be used to provide mechanical integrity for the leadframe. The leadframe fingers can be printed using a superconductive paste or a superconductive precursor paste which is subsequently treated to exhibit superconductivity.

9 Claims, 5 Drawing Sheets

PRINTABLE SUPERCONDUCTIVE LEADFRAMES FOR SEMICONDUCTOR DEVICE ASSEMBLY

This is a divisional of application Ser. No. 08/143,843, filed Oct. 28, 1993, now abandoned.

TECHNICAL FIELD OF THE INVENTION

The present invention relates to the fabrication and packaging of semiconductor devices, and more particularly to the fabrication of leadframes for semiconductor device assemblies.

BACKGROUND OF THE INVENTION

Leadframes, and the like, are commonly employed in semiconductor device assemblies. Generally, a die is mounted in a central area of the leadframe, and wire-bonded or TAB-bonded to inner ends of conductive fingers of the leadframe. The inner ends of the conductive fingers are very closely spaced, and the conductive fingers fan-out from the area of the die. The same principle is applicable to conductive traces on a substrate, where a die is mounted in a central area of the conductive traces and connected to the inner ends of the conductive traces (such as with ceramic and tape based packages).

The present invention is primarily concerned with the fabrication of leadframes, which are typically etched or stamped from a foil of metal. A typical leadframe (stamped, etched, or otherwise) will often include one or more sacrificial members which bind the separate conductive fingers of the leadframe into a single unit to facilitate assembly. These sacrificial members are usually excised immediately before or after assembly into a semiconductor device assembly.

In order to manufacture a stamped or etched leadframe, a fairly substantial "foil" (sheet) of conductive material must be provided. If the leadframe is too thin, it will not have sufficient mechanical stability and will not withstand the manufacturing and assembly processes. Very thin sheets do not lend themselves well to stamping.

As modern technology pushes interconnection density in semiconductor device assemblies ever higher, however, it becomes increasingly difficult to manufacture adequate leadframes. Among the greatest problems in forming high-density, fine-line leadframes are:

problems with complex stampings (tooling, sheet thickness, etc.);

difficulties in forming high-aspect ratio (i.e., tall) leadframe fingers;

increased resistance and limited current carrying capability in fine leadframe fingers; and difficulties and/or expense in forming complicated fine-line patterns.

As the complexity of a stamped leadframe increases, the complexity of the stamping tools required to make the leadframe goes up accordingly. Complex tooling can add considerably to the cost of production of a leadframe and, consequently, of the completed semiconductor device assembly. Further, as features of the stamping tool become increasingly fine, they become more delicate and consequently more susceptible to wear and/or breakage. Additionally, if the thickness of the sheet of conductive material combined with the close spacing and small size of leadframe fingers spacing requires that the leadframe fingers be significantly taller than they are wide, the leadframe can become exceedingly difficult to produce. It is well understood to those of ordinary skill in the art that it is not practical to attempt to stamp a high-aspect-ratio leadframe.

Wet-etching processes for forming leadframes generally require a patterned layer of etch resist to be deposited over the conductive material. Areas of the conductive material desired to be removed are exposed through the etch-resist and are then etched away. Etching processes can provide extremely fine features, but are extremely susceptible to undercutting of the resist by the etchant when deep etching is attempted. This undercutting severely limits the height (aspect ratio) of conductive leadframe fingers which can be formed by etching. Further, wet-etching processes tend to be messy and wasteful of material. Unlike stamping processes where the unused, stamped-out material is readily recovered, etching processes dissolve undesired portions of the conductive material in a solvent, making any material recovery difficult, at best.

An inherent problem with the manufacture of leadframes is that the conductive fingers cannot be made very small with etching or stamping techniques. Typical dimensions for leadframe fingers are on the order of several thousandths of an inch, with similar spacing therebetween. These relatively large dimensions do not lend themselves very well to having a very high member of conductive finger ends surrounding a die-receiving area. What is needed is a technique that can be employed to form robust leadframes exhibiting a very fine pitch adjacent the die-receiving area so that a large number of connections to dies can be accommodated.

As is known, the resistance exhibited by a conductive line (e.g., a leadframe finger) is a function of the resistivity and cross-sectional area of the conductive material of the conductor. As the cross-sectional area of leadframe fingers goes down, their resistance goes up. Higher connection resistance can be particularly troublesome in higher-speed integrated circuitry.

One of the most significant forces driving the trend towards higher interconnection density is the increasing density (and complexity) of modern integrated circuitry resulting from semiconductor fabrication processes which are capable of producing ever-smaller transistors. As transistor size (and semiconductor feature size, in general) decreases, the currents which flow between circuits also tends to decrease. This would seem to limit, at least to some extent, the effect of higher resistance conductive lines (due to smaller size). However, maximizing the speed of integrated circuits remains a highly desirable goal.

Typically, a board (system) contains a plurality of integrated circuit devices passing signals to one another through the intermediary of their respective leadframes. Higher resistance leadframe fingers contribute to chip-to-chip wiring delays when combined with the effects of parasitic capacitances. The wiring resistance and the capacitances combine to form an R-C network which slows voltage waveforms, thereby slowing overall circuit performance. Further, although currents between transistors on an integrated circuit tend to decrease in magnitude with the size of the transistors, the currents required at the I/O pads of the integrated circuit generally do not decrease commensurately. In general, the same or similar current carrying capability is required at the "pins" (e.g., bond pads) of the integrated circuit, regardless of the circuit geometry, and these somewhat "fixed" currents need to be carried by the conductive fingers of the leadframes.

As evidenced by the above discussion, what is needed are techniques capable of forming high-density, fine-line leadframes which exhibit extremely low resistivity (i.e., high conductivity).

DISCLOSURE OF THE INVENTION

It is therefore an object of the present invention to provide improved techniques for manufacturing high-density fine-line leadframes for semiconductor device assemblies.

It is a further object of the present invention to provide a technique for manufacturing high-density, fine-line leadframes which eliminates the need for expensive tooling.

It is a further object of the present invention to provide a technique for manufacturing high-density, fine-line leadframes which does not require formation of a patterned resist layer.

It is a further object of the present invention to provide a technique for leadframe manufacturing which readily accommodates complex fine-line patterns of leadframe fingers.

It is a further object of the present invention to provide high-density, fine-line leadframes which exhibit very low leadframe finger resistance.

According to the invention, the conductive fingers of a leadframe are created using printing techniques. For example, thick-film screen-printing techniques, are employed. The conductive fingers are printed onto a backing substrate, which may be sacrificial (removed after the conductive fingers are formed). In a preferred embodiment, a conductive paste is screen-printed onto a backing sheet (substrate), and is then cured (such as by air drying at an elevated temperature).

According to various aspects of the invention, the conductive paste can be a conventional, low-resistivity thick film conductive paste, a superconducting thick-film paste, or a superconductive precursor paste which is subsequently converted to a superconducting material after printing.

According to an aspect of the invention, only a portion of the backing sheet is removed after the conductive fingers are printed and cured. For example, the backing can be removed in the area where a die is to be mounted, forming an opening in the backing sheet, and the remaining backing can be left in place to provide mechanical support for the leadframe fingers.

According to a further aspect of the invention, the opening in the backing substrate can be used to facilitate cooling of all surfaces of a semiconductor die subsequently mounted to the leadframe.

According to a further aspect of the invention, the opening in the backing substrate can be used to facilitate formation of a molded package body.

According to another aspect of the invention, the printed leadframe can include sacrificial members to provide mechanical integrity during handling of the leadframe, and these sacrificial members can be removed immediately prior to or after packaging the leadframe and die (e.g., after plastic molding).

According to another aspect of the invention, a removable backing substrate can be a releasable paper-like sheet, such as "fish-paper" (waxy paper), "MYLAR" (tm), or similar paper or plastic treated with a release agent to facilitate its subsequent removal from the printed conductors of the leadframe. According to another aspect of the invention, a removable backing can be made of a material which can be dissolved or etched away after printing of the leadframe conductors.

By printing the leadframe, rather than stamping or etching it, high-resolution, fine-line conductors can be produced without expensive tooling, using well-known, proven thick-film techniques. No resist layer or etching process is required, and the printing screen-stencil can be produced using conventional photographic/photo-etching techniques.

By employing superconductive pastes, zero-resistance leadframe fingers can be produced, effectively eliminating the deleterious effects of high finger resistance which might otherwise occur in fine-line leadframes.

Other objects, features and advantages of the invention will become apparent in light of the following description thereof.

DETAILED DESCRIPTION OF THE INVENTION

According to the invention, high-density, fine-line leadframes are fabricated using printing techniques, such as thick-film screen-printing techniques. Other printing techniques are contemplated, such as offset and gravure. The result is a "printed leadframe" suited to semiconductor device assemblies with high interconnection density. In the main, hereinafter, thick-film type printing techniques are discussed.

In printing thick-film conductors, a screen stencil is prepared by blocking-off or "masking" portions of a fine screen. This is accomplished in one of several ways. One method is to coat a screen with a photo-sensitive masking material and to expose and develop the coated screen in a photographic process to remove unwanted portions of the masking material. Another technique is to adhere a solid sheet of a masking material to a screen and to etch the sheet to remove unwanted portions. For precision and very fine printing, rather than starting with a mesh screen, a solid sheet of metal is selectively etched to form screen holes through the sheet in the desired pattern.

Once the screen has been appropriately formed, it is used as a stencil for printing on a printing substrate (backing substrate). A conductor "ink" or "paste" is forced through the screen stencil onto the surface of the printing substrate. The "ink" or "paste" is then appropriately cured to form solid conductors on the substrate. The curing process will vary depending upon the composition of the specific conductor paste which is used.

A typical conductor paste is typically composed primarily of finely ground metal, "frit", and an organic vehicle. "Frit"

is a melted-glass composition, finely ground and mixed into the conductor paste. When the paste is printed as a "trace" on the substrate, the frit melts upon firing to give adhesion to the substrate and to hold the composition together. The organic vehicle dissipates upon firing, and the frit coalesces primarily at the surface of the trace. The ground metal binds together (fuses) under heat to provide the conductive characteristics of the trace.

This process of "firing" pastes to cure them works quite well, but is best suited to printing on heat tolerant substrate materials such as ceramics, and is almost completely inappropriate for use with plastic substrates. Other techniques can be used to print conductors on heat-intolerant materials such as papers and plastics.

One such technique involves providing a metal slurry of finely ground metal particles (e.g., noble metals such as silver, palladium, gold and platinum) mixed in combination with finely-ground particles of other metals (e.g., nickel and tin), a vaporizable solvent, and a small amount of a curable plastic binder material. The metal makes up the bulk of the slurry (about 95% or thereabouts). The slurry is essentially a conductive paste suited to screen printing. After printing to form conductive traces (which will become the leadframe lead fingers), a relatively low heat (e.g., about 330° F.) is used to boil off the solvent. The traces are then compressed to increase their conductivity.

Conductive material of this type can be printed on a backing of "fish paper" (commercially available paper coated with a release agent) using a rigid backing. After printing and curing, the backing can be readily peeled away.

The physical and electrical properties of conductive pastes (before and after curing or firing) are well established. Those of ordinary skill in the art will immediately understand that some pastes cure into forms that are mechanically stronger and/or resilient than others. Electrically, these thick film pastes behave much like "conventional" conductive materials used for leadframe fingers and can become quite resistive when their cross-sectional area (i.e., perpendicular to the direction of current flow) is very small. Those of ordinary skill in the art will immediately appreciate that only pastes which produce traces of high conductivity are desirable in order to minimize this effect.

It is well known and established in the art that high interconnect resistance can wreak havoc with the performance of high-speed semiconductor assemblies due to the effects of parasitic capacitances. These resistances work with the parasitic capacitances to form R-C networks which can significantly slow signals between circuits. In order to minimize this effect, the parasitic capacitances, the interconnect resistances, or both, must be minimized. Often, there is little that can be done to eliminate the capacitances, so measures must be taken to minimize interconnection resistance. The lengths of interconnections can be minimized, but component spacing and the paths which leadframe fingers must take set limits on how short the interconnections can become. The only approach left is to minimize the resistivity of the material of the leadframe fingers themselves, such as superconductive materials.

In recent years, new materials have been discovered which exhibit super-conductivity at relatively high temperatures. Examples of these materials are thallium and YBCO (yttrium barium copper oxide). Thallium films, for example, have been found to be useful in microwave and RF applications.

Although it might seem that the use of superconductive materials for leadframe fingers is somewhat self-evident, the materials are extremely difficult to pattern, because, inter alia, of their inability to be etched with high resolution, high productivity plasma equipment. Neither the superconductors nor their component atoms form volatile compounds which can be easily removed. Wet etching is possible, but not easy, and the masking of high resolution lines is problematic (e.g., using photolithography techniques).

Superconductors have been arbitrarily divided into two main categories: high-temperature superconductors (HTS's) and low-temperature superconductors (LTS's). Low temperature superconductors are those which exhibit superconductivity only at temperatures below 30° K. (kelvin). High temperature superconductors are those which remain superconductive at temperatures above 30° K. Some high-temperature superconductors, such as those based on Yttrium exhibit superconductivity at temperatures well over 100° K. Because of their sensitivity to heat, semiconductor device assemblies employing superconductors must be actively cooled (at least the superconductors must be cooled) to prevent the superconductors from becoming non-superconductive when subjected to heat generated within the semiconductor devices. Because of their relatively higher-temperature superconductivity characteristics, HTS's can be cooled inexpensively using liquid nitrogen. LTS's generally require more complicated and expensive cooling setups, using, e.g., liquid helium, which is considerably more expensive and difficult to handle than liquid nitrogen. HTS's are particularly useful as conductors in semiconductor device assemblies, because electrical properties of the materials used in silicon-based semiconductor devices are nearly optimal at higher temperatures within the superconducting temperature range of HTS's.

In order to print superconductive traces, a superconductive printing technique is required. According to the invention, by way of example, superconductive traces can be printed using techniques such as:

1) using a conductive paste which cures to a material which is inherently superconductive can be used; or
2) using a superconductive "precursor" material which, after printing, can be treated to convert it to a true superconductive material.

For example, superconductive materials having the generalized composition of $(La_{1-x}M_x)_yCuO_{4-\delta}$ (where M is an alkali earth metal or a mixture of alkali earth metals; x=0 to 1, y=1.5 to 2.5; and $\delta$=0 to 1) or $(N_{1-x}M_x)_pCu_qO_{7-\delta}$ (where N is Sc, Y, or a lanthanide; x=0 to 1, y=1.5 to 2.5; p=2.5 to 3.5, q=1.5 to 3.5, and $\delta$=0 to 1) are known to include high temperature superconductors which exhibit superconductivity above the temperature of liquid nitrogen. Such superconductive materials can be finely ground into a powder and mixed with an organic solvent (e.g., octyl alcohol, propylene glycol, or heptyl alcohol) to form a conductive paste which can be screen printed on a substrate which is non-reactive to the superconductive material. After printing in the form of conductive traces, the organic solvent is boiled off and the substrate and traces are fired. The resultant traces are high-temperature superconductive.

Another suitable technique provides a precursor material by preparing a solution of a solvent and metal-ligand compounds of each of the metal components (in appropriate proportions) of a superconductive material. The solution is sprayed to form fine droplets. The solvent is then evaporated (at least in part) from the liquid droplets so that fine solid particles are formed. The solid particles are combined in a liquid carrier to form a precursor paste which can be screen printed onto a substrate. After printing with the paste, the substrate and paste are heated in the presence of oxygen to volatilize the ligands and to convert the precursor to a superconductor.

Various embodiments of the present invention are described below with respect to FIGS. 1a–4b.

Figure 1A:
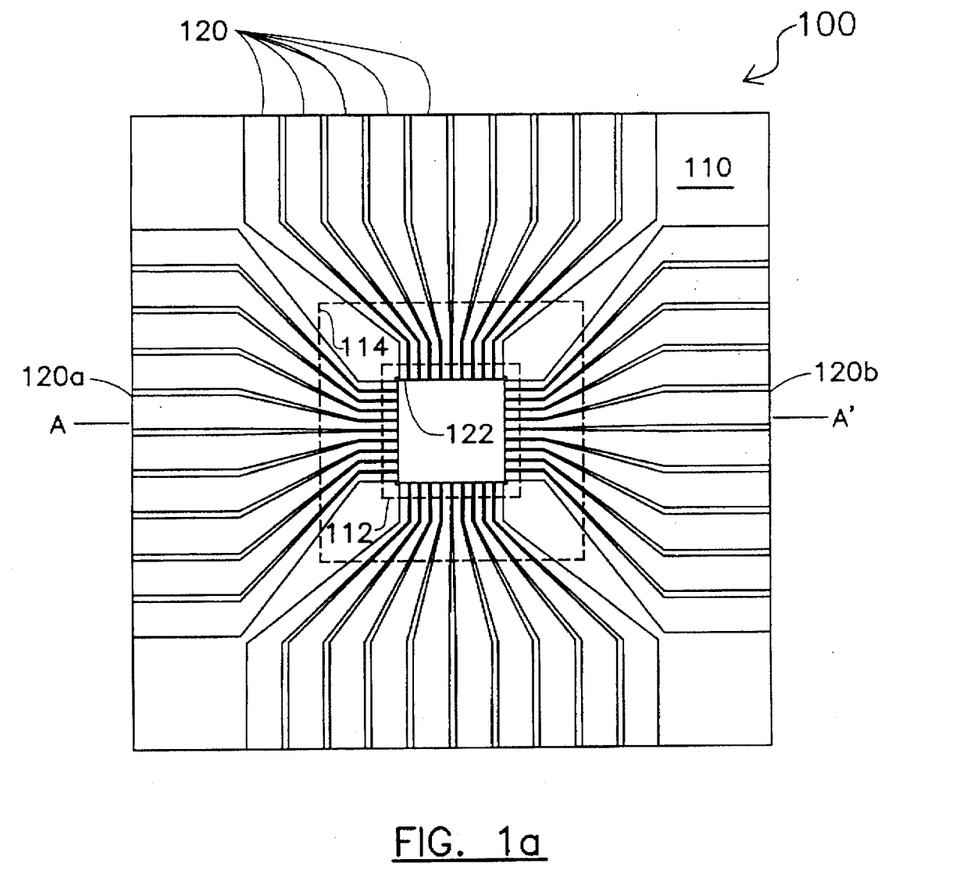
FIG. 1a is a top view of a printed leadframe, according to the invention.

FIG. 1a is a top view of a printed leadframe 100, according to the invention. The leadframe 100 comprises a plurality of leadframe fingers 120 printed on a surface of a backing substrate 110. In this case, the backing 110 provides mechanical support for the printed fingers 120. The fingers 120 can formed of either "conventional" conductive materials or of superconductive materials, and are printed onto the substrate 110 using thick-film screen-printing techniques such as those described hereinabove.

Figure 1B:
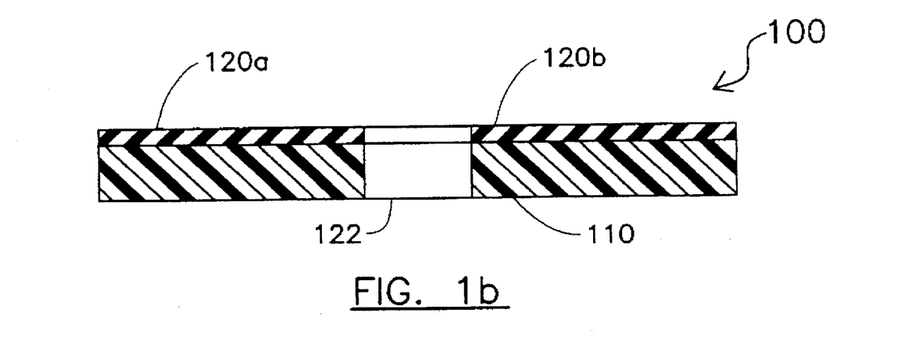
FIG. 1b is a cross-sectional view of the printed leadframe of FIG. 1a, according to the invention.

A dashed line 114 defines a central die-receiving area within the outline of which a semiconductor die (not shown) is to be mounted. Another dashed line 112 defines the mounting location of the semiconductor die. A centrally located opening 122 extends through the substrate 110 between inner ends of the printed leadframe fingers 120. FIG. 1b is a cross-sectional view of the printed leadframe 100 through section line A—A' which passes through two printed leadframe fingers 120a and 120b, further illustrating the opening 122 and the raised, thick-film printed nature of printed fingers 120a and 120b. (The leadframe fingers at the 'far' end of this view are visible, end-on, in the view of FIG. 1b.)

In semiconductor device assemblies where a protective package body (such as molded plastic) is required, the central opening facilitates formation of a molded package body by permitting access to the underside of the die. The opening 122 facilitates complete coverage by the molding compound (encapsulant) and permits the molded body to extend through the substrate, thereby "locking" it to the substrate (this is described in greater detail hereinbelow with respect to FIG. 3c). In superconducting leadframes (i.e., when the leadframe fingers 120 are printed using a superconductive material) the opening 122 can be used to promote cooling of a semiconductor die (outline area shown generally as 112) attached to the leadframe fingers 120 by permitting free access to all surfaces of the die by a coolant (such as liquid nitrogen).

The substrate 110 can be formed of a "sacrificial" material which is removed from the leadframe fingers 120, leaving behind a patterned superconductive leadframe for semiconductor device assembly formed from the superconductive material 120. In such an arrangement, the "sacrificial" substrate can be formed of a material which can be dissolved away, etched away, or "peeled" away (e.g., fish paper or mylar, etc.) from the leadframe fingers 120. The sacrificial substrate 110 can be removed at any suitable stage of assembly, either before or after attaching a semiconductor die to the leadframe fingers 120.

It should be recognized that the leadframe pattern shown in FIG. 1a is merely representative of leadframe patterns in general. For example, the leadframe pattern of FIG. 1a does not include any sacrificial "tie-bars", "dambars", or other sacrificial leadframe elements for giving the leadframe mechanical integrity in the absence of the backing substrate 110. Such sacrificial elements (members) are well known in the art and may be readily incorporated into the leadframe pattern by one of ordinary skill in the art. Further, if the substrate 110 is a sacrificial material, then the substrate itself can substitute for sacrificial leadframe members during assembly of the leadframe 100 into a semiconductor device assembly. Once the substrate is no longer needed, the substrate 110 can be removed. This technique has the advantage that it is not necessary to stress the conductive fingers 120 of the leadframe 100 by excising or breaking away pieces of the conductive structure of the leadframe 100.

Figure 2:
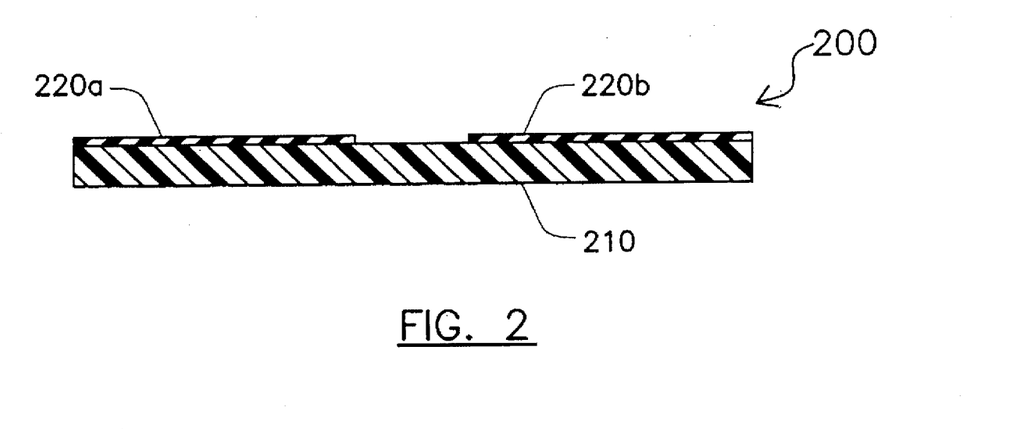
FIG. 2 is a cross-sectional view of a printed leadframe on a solid backing substrate, according to the invention.

FIG. 2 is a cross-sectional view of a printed leadframe 200, similar to the printed leadframe 100 (FIGS. 1a–b), having printed leadframe fingers 220a and 220b formed on a backing substrate 210. In this case, however, the backing substrate 210 is a solid, single piece, having no central opening. This type of printed leadframe is the simplest to make, but lacks some of the advantages of a central opening described above with respect to FIGS. 1a–b.

As before, the leadframe fingers can be printed using either conventional thick-film conductors or using superconductive material, and the backing substrate 210 can be a sacrificial substrate formed of a material which can be dissolved away, etched away, or "peeled" away from the leadframe fingers 220a and 220b. The sacrificial substrate 210 can be removed at any suitable stage of assembly, either before or after attaching a semiconductor die to the leadframe fingers 220a and 220b.

Figure 3A:
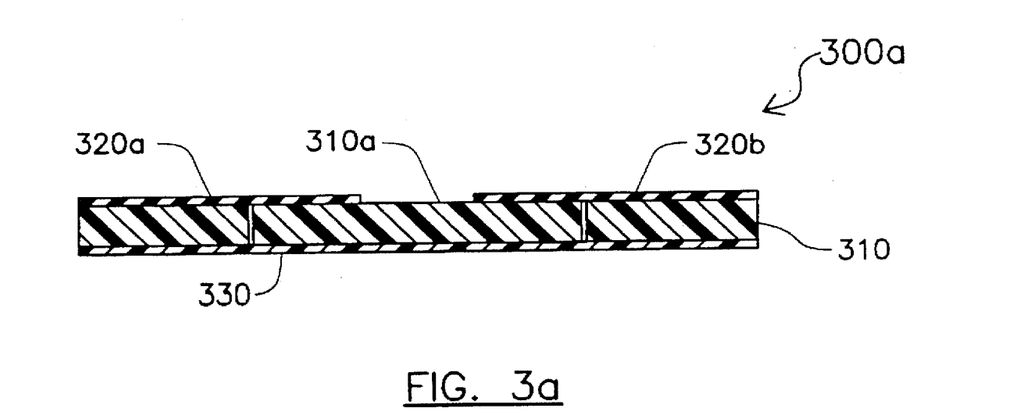
FIG. 3a is a cross-sectional view of a printed leadframe formed on a segmented substrate with a removable center portion, according to the invention.

FIG. 3a is a cross-sectional view of a printed leadframe 300a formed on a segmented substrate 310. The segmented substrate 310 has a removable central portion 310a. As shown in the Figure, the removable central portion 310a is held together with the rest of the substrate 310 by an adhesive backing 330. Printed leadframe fingers 320a and 320b are formed on the surface of the segmented substrate 310 such that they extend over a portion of the removable central portion 310a. The removable portion 310a need not be made of the same material as the remainder of the substrate 310, and can be coated with a suitable release agent to facilitate its removal from the leadframe fingers 320a and 320b. Alternatively, a material can be selected for the removable portion 310a from which the leadframe fingers 320a and 320b will readily release, eliminating the need for a release agent.

Figure 3B:
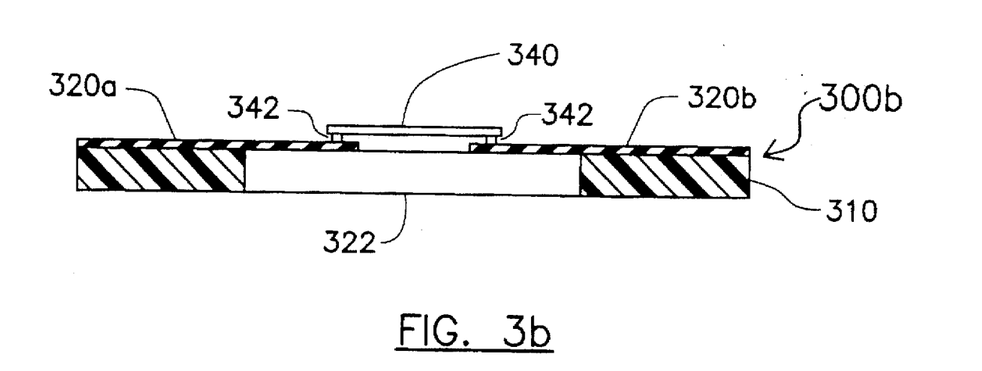
FIG. 3b is a cross-sectional view of the printed leadframe of FIG. 3a with the center portion of the segmented substrate removed and a semiconductor die assembled to the leadframe fingers, according to the invention.

FIG. 3b is a cross-sectional view of a printed leadframe assembly 300b formed by removing the adhesive backing 330 and central portion 310a from the printed leadframe 300a (FIG. 3a) and assembling a semiconductor die 340 to the leadframe fingers 320a and 320b via solder bump connections 342 (or other electrical connections). The removable central portion 310a (FIG. 3a) can be removed either prior to or subsequent to mounting of the semiconductor die 340. Leaving the removable portion 310a in place during assembly of the semiconductor die 340 to the leadframe fingers 320a and 320b can be advantageous in that the removable central portion 310a will provide mechanical support for the leadframe fingers 320a and 320b and maintain leadframe finger spacing.

As with the other embodiments shown and described above, the leadframe fingers 320a and 320b can be printed using either "normal" conductive material or superconductive material.

If the semiconductor device assembly (leadframe assembly) 300b is to be used in an actively or extensively cooled environment (such as may be necessary if superconductive leadframe fingers are employed) it is advantageous to use the assembly as shown in FIG. 3b. The opening 322 in the substrate 310b can permit the coolant (e.g., liquid nitrogen) to flow freely about all surfaces of the die, thereby cooling it more effectively and minimizing the likelihood that die heating will cause transition of nearby superconductive materials to a non-superconductive state.

With non-superconductive materials, however, especially when active cooling will not be employed, it may be more advantageous to provide a package body around the semiconductor die, as described below with respect to FIG. 3c. It may also be desirable to provide a similar package body even with superconductive leadframes, with or without active or extensive cooling means for the die.

Figure 3C:
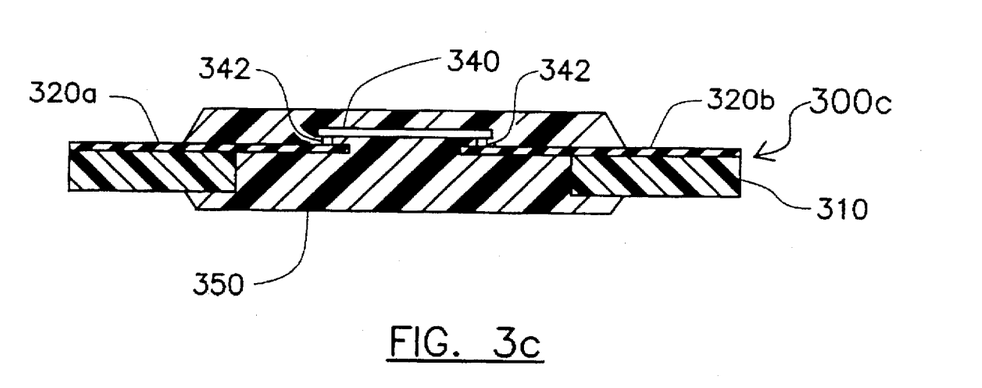
FIG. 3c is a cross-sectional view of the assembly of FIG. 3b after formation of a molded body, according to the invention.

FIG. 3c is a cross-sectional view of an assembly 300c formed by molding a plastic package body 350 around the die 340c, solder bump connections 342c, and portions of the substrate 310c and leadframe fingers 320a and 320b of the leadframe assembly 300b of FIG. 3b. The opening 322 (of FIG. 3b) facilitates the flow of molding compound around the die 340c, and permits the molding compound to extend through the substrate 310c and partially over both major surfaces of the substrate 310c, thereby firmly "locking" the package body 350 to the substrate 310.

One of ordinary skill in the art will readily understand that other portions of the substrate 310 can be made removable (sacrificial) such that other portions of the leadframe fingers (e.g., 320a and 320b) are exposed and self-supporting. This can be advantageous in a "flat-pack" type of package where outer ends of the leadframe fingers provide the connection points ("pins" of the package) by which external electrical connections are made. Remaining portions of the substrate 310 can be use to tie the separate leadframe fingers together mechanically before, during, and after assembly. Removable portions of the backing substrate 310 can be removed after they are no longer needed.

It is possible, using the techniques of the present invention, to produce a completely free-standing, self-supporting leadframe. Such a leadframe is produced by screen-printing a pattern of a leadframe, complete with sacrificial support members, on a sacrificial backing substrate (e.g., "fish paper" treated with a suitable release agent, or other suitable removable substrate), using a conductive thick-film techniques. After "curing" of the printed leadframe, the sacrificial backing is removed, leaving the printed leadframe pattern behind. As with conventional etched or stamped leadframes, the sacrificial members of the leadframe are excised once they are no longer needed. Such a leadframe is shown and described hereinbelow with respect to FIGS. 4a and 4b.

Figure 4A:
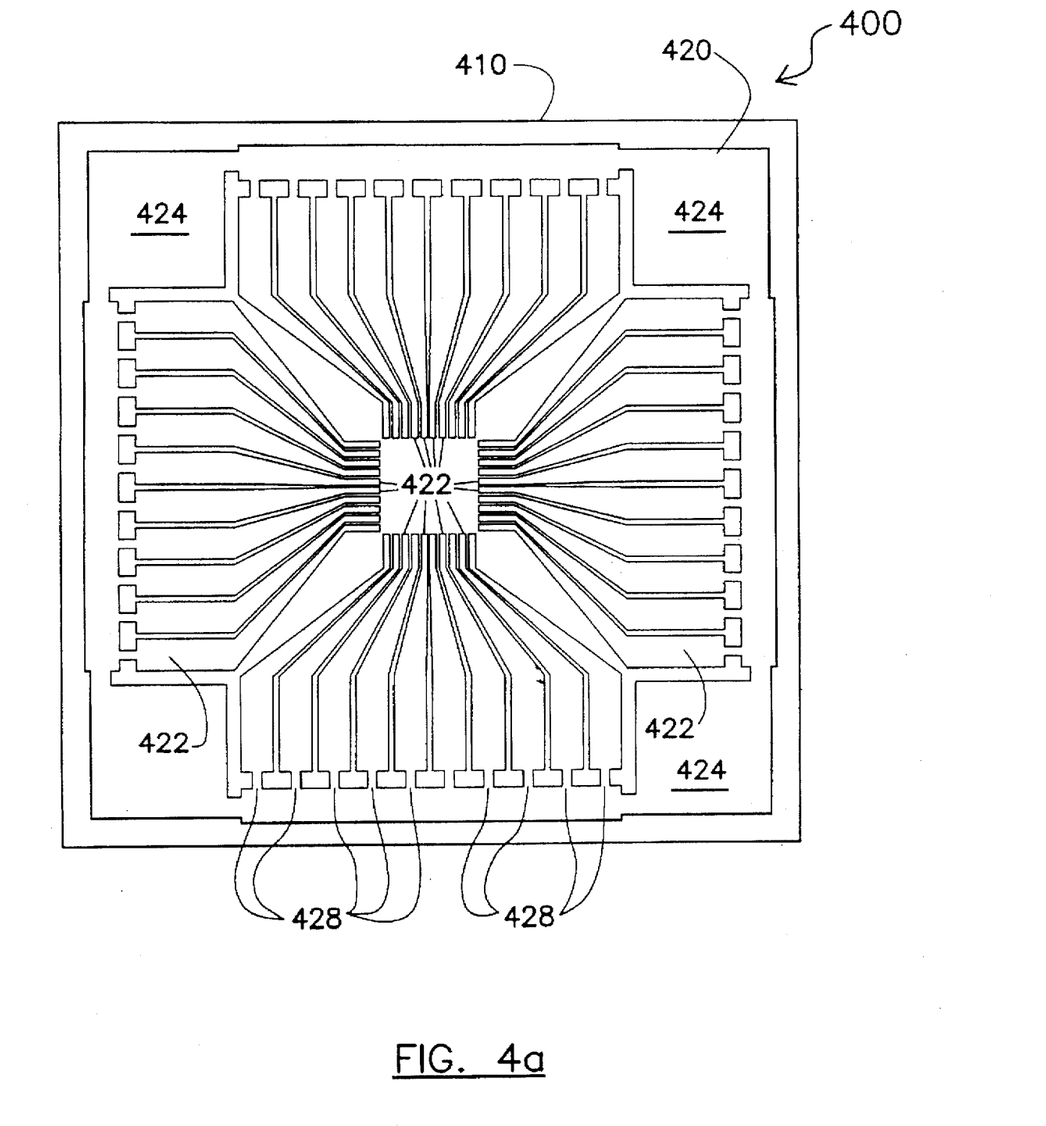
FIG. 4a is a top view of a printed leadframe with sacrificial backing, according to the invention.
Figure 4B:
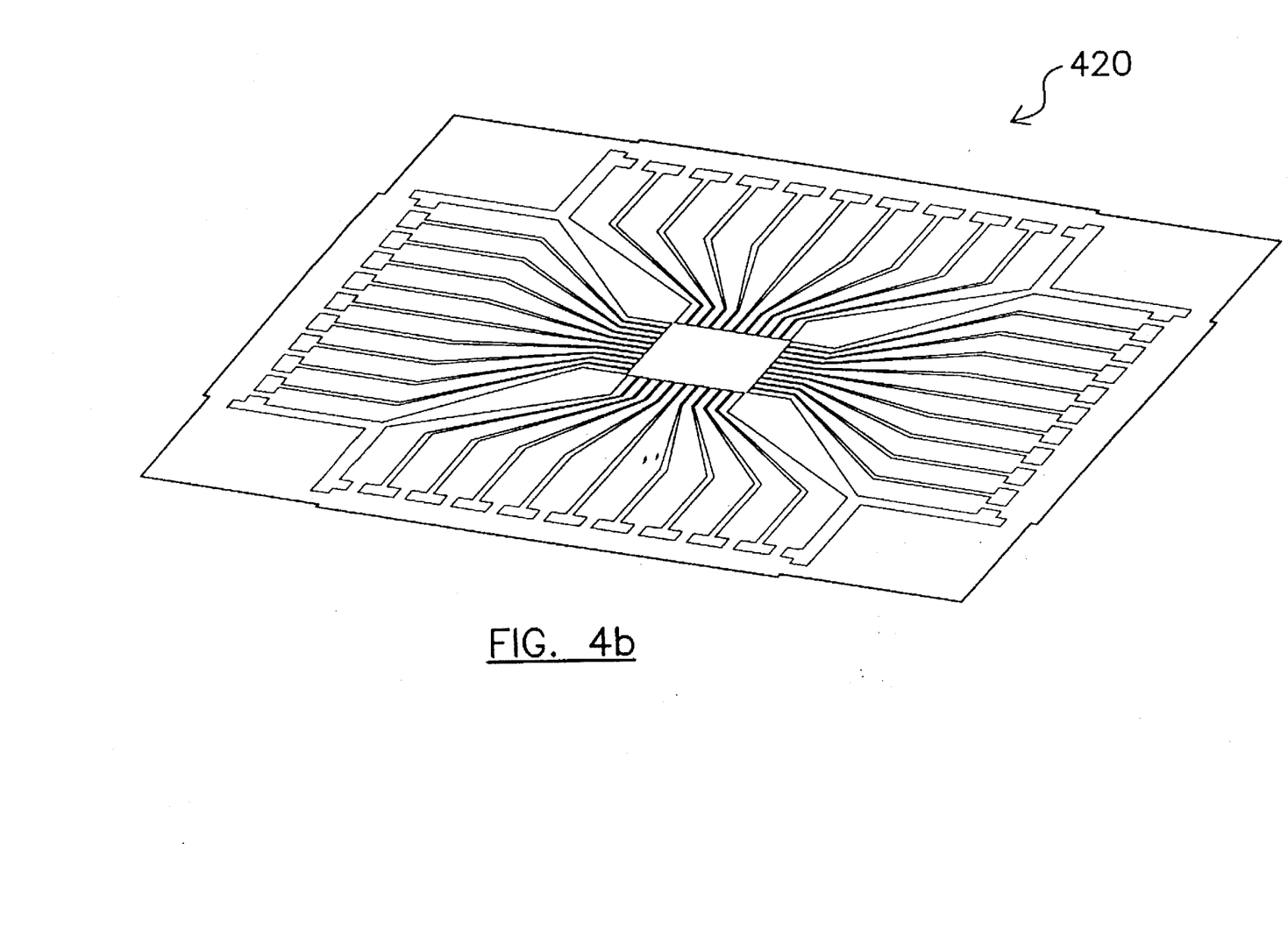
FIG. 4b is a perspective view of the leadframe of FIG. 4a with the backing removed, according to the invention.

FIG. 4a is a top view of a printed leadframe arrangement 400 comprising a conductive printed leadframe 420 printed using thick-film screen printing techniques on a sacrificial backing substrate 410. The sacrificial backing can be a commercially-available "fish paper" treated with a release agent, a plastic material, or any other material which can be readily removed from the leadframe 420 by peeling, dissolving, etching, or any other suitable method. The leadframe 420 itself includes a plurality of leadframe fingers 422 (a representative few of which are indicated), and sacrificial members 424. The sacrificial members 424 are joined to the leadframe fingers 422 by thin connecting members 428 so that the leadframe 420 may be handled as a unit after the backing 410 is removed. The leadframe 420 appears as shown in FIG. 4b after the backing 410 is removed (the numbering of elements, in this view, is omitted, for illustrative clarity).

When the sacrificial members 424 of the leadframe 420 are no longer needed, they are excised by breaking the thin connecting members 428.

It is intended that the techniques of the present invention, described hereinabove, be used either alone or in combination. It is fully within the spirit and scope of the present invention to do so. For example, any of the printed leadframes can be printed with conventional conducting pastes, superconducting pastes, or superconducting precursor pastes which are subsequently treated to convert them to superconductors. By way of further example, the free-standing leadframe shown and described with respect to FIGS. 4a and 4b can make use of a segmented backing substrate wherein only portions of the backing substrate are removed. The remaining portions of the backing substrate can be used to maintain lead finger spacing and to provide mechanical integrity.

The above, and other objects, features, advantages and embodiments of the invention, including other (i.e., additional) embodiments of the techniques discussed above may become apparent to one having ordinary skill in the art to which this invention most nearly pertains, and such other and additional embodiments are deemed to be within the spirit and scope of the present invention.

What is claimed is:

1. A method of making a semiconductor device assembly, comprising:

providing a backing substrate;

screen-printing a leadframe pattern on the backing substrate using a superconductive paste;

providing an opening in the backing substrate in a die mounting area of the leadframe pattern;

curing the printed superconductive leadframe pattern at a temperature of not more than 330 degrees Fahrenheit; and mounting a semiconductor die to the printed superconductive leadframe pattern.

2. Method, according to claim 1, wherein:

the superconductive paste is a superconductive precursor paste.

3. Method, according to claim 2, further comprising:

treating the superconductive precursor paste, after printing, to convert it to superconductivity.

4. Method, according to claim 1, wherein the superconductive leadframe is superconductive at temperatures from about 30 to 100 degrees Kelvin.

5. Method, according to claim 1, further comprising the step of compressing the superconductive leadframe pattern.

6. Method, according to claim 1, wherein the superconductive leadframe is thallium.

7. Method, according to claim 1, wherein the superconductive leadframe is yttrium barium copper oxide.

8. Method, according to claim 1, wherein the superconductive paste is a finely ground powder of superconductive materials mixed with an organic solvent.

9. Method, according to claim 8, wherein the organic solvent is selected from the group consisting of octyl alcohol, propylene glycol and heptyl alcohol.

* * * * *